United States Patent
Lyu et al.

(10) Patent No.: US 7,019,099 B2
(45) Date of Patent: Mar. 28, 2006

(54) SILOXANE-BASED RESIN AND METHOD FOR FORMING INSULATING FILM BETWEEN INTERCONNECT LAYERS IN SEMICONDUCTOR DEVICES BY USING THE SAME

(75) Inventors: Yi Yeol Lyu, Daejun-Shi (KR); Jin Heong Yim, Daejun-Shi (KR); Sang Kook Mah, Seoul (KR); Eun Ju Nah, Daejun-Shi (KR); Il Sun Hwang, Daejun-Shi (KR); Hyun Dam Jeong, Suwon-Shi (KR); Jung Hyung Kim, Daejun-Shi (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/621,380

(22) Filed: Jul. 18, 2003

(65) Prior Publication Data

US 2004/0024164 A1    Feb. 5, 2004

Related U.S. Application Data

(63) Continuation of application No. 10/105,723, filed on Mar. 27, 2002, now Pat. No. 6,623,711, which is a continuation-in-part of application No. 09/895,158, filed on Jul. 2, 2001, now Pat. No. 6,660,822.

(30) Foreign Application Priority Data

Mar. 27, 2001  (KR) .............................. 2001-15884
Sep. 14, 2001  (KR) .............................. 2001-56798

(51) Int. Cl.
   *C08G 77/18* (2006.01)
(52) U.S. Cl. .......................................... 528/39; 528/34
(58) Field of Classification Search ................ 528/39, 528/34

See application file for complete search history.

(56) References Cited

U.S. PATENT DOCUMENTS

| 3,615,272 | A |   | 10/1971 | Collins et al. |
| 5,010,159 | A |   | 4/1991  | Bank et al. |
| 5,378,790 | A | * | 1/1995  | Michalczyk et al. .......... 528/35 |
| 5,853,808 | A |   | 12/1998 | Arkles et al. |
| 6,000,339 | A |   | 12/1999 | Matsuzawa |
| 6,005,131 | A | * | 12/1999 | Jentsch et al. .............. 556/434 |
| 6,232,424 | B1 |  | 5/2001  | Zhong et al. |
| 6,284,834 | B1 |  | 9/2001  | Kirchmeyer et al. |
| 6,413,446 | B1 | * | 7/2002  | Mechtel et al. ............. 252/181 |
| 6,623,711 | B1 | * | 9/2003  | Lyu et al. ..................... 423/12 |
| 6,660,822 | B1 | * | 12/2003 | Lyu et al. ..................... 528/35 |

* cited by examiner

*Primary Examiner*—Margaret G. Moore
(74) *Attorney, Agent, or Firm*—Harness, Dickey & Pierce PLC

(57) ABSTRACT

Disclosed herein are siloxane-based resins prepared by hydrolyzing and polycondensing cyclic and/or cage-shape siloxane compounds, optionally with at least one silane compound, in an organic solvent in the presence of a catalyst and water. Also, disclosed herein are methods for forming insulating film between interconnect layers in semiconductor devices by using the siloxane-based resins thus prepared as low dielectric insulating materials.

11 Claims, No Drawings

SILOXANE-BASED RESIN AND METHOD FOR FORMING INSULATING FILM BETWEEN INTERCONNECT LAYERS IN SEMICONDUCTOR DEVICES BY USING THE SAME

This application is a continuation of Ser. No. 10/105,723, filed Mar. 27, 2002 and now U.S. Pat. No. 6,623,711, which is a CIP application of Ser. No. 09/895,158, filed Jul. 2, 2001 and now U.S. Pat. No. 6,660,822.

FIELD OF THE INVENTION

The present invention relates to a siloxane-based resin and a method for forming insulating film between interconnect layers in semiconductor devices by using the same. More specifically, the present invention relates to a siloxane-based resin prepared by hydrolyzing and polycondensing cyclic and/or cage-shape siloxane compounds, optionally with at least one silane compound, in an organic solvent in the presence of a catalyst and water. The present invention also relates to a method for forming insulating film between interconnect layers in semiconductor devices, wherein the siloxane-based resin described above is used as low dielectric insulating materials.

BACKGROUND OF THE INVENTION

As the circuit density in multilevel integrated circuit devices increases, the reduction of feature size in a semiconductor device is strongly required. But, there are fatal problems such as R(resistance)×C(capacitance) delay due to crosstalk between interconnect lines. Therefore, dielectric constant of interlayer insulating films should be lowered so as to decrease the RC delay as much as possible. For this purpose, there have been various attempts to develop low dielectric materials for use in the insulating film.

For example, polysilsesquioxanes having dielectric constant of approximately 2.5~3.1 has replaced $SiO_2$ having dielectric constant of 4.0 in chemical vapor deposition (CVD). Such polysilsesquioxanes can be also applied to a spin coating method due to its excellent planation property.

The polysilsesquioxanes as well as preparing methods thereof are well known in the art. For example, U.S. Pat. No. 3,615,272 discloses a method for preparing completely condensed soluble hydrogensilsesquioxane resins, which comprises the steps of condensing trichlorosilanes in a sulfric acid medium, and then washing the resulting resins with water or aqueous sulfuric acid. U.S. Pat. No. 5,010,159 discloses a method for synthesizing soluble condensed hydridosilicon resins, which comprises the steps of hydrolyzing hydridosilanes in an arylsulfuric acid hydrate-containing hydrolysis medium, and then contacting the resulting resins with a neutralizing agent. U.S. Pat. No. 6,232,424 describes a highly soluble silicone resin composition having excellent solution stability, which was prepared by hydrolyzing and polycondensing tetraalkoxysilane, organosilane and organotrialkoxysilane monomers in the presence of water and a catalyst. U.S. Pat. No. 6,000,339 teaches that a silica-based compound, which may be useful for improving the resistance and physical properties as well as thickness of a coating film, can be obtained from a reaction of a monomer selected from the group consisting of alkoxysilane, fluorine-containing alkoxysilane and alkylalkoxysilane and a titanium- or zirconium-alkoxide compound in the presence of water and a catalyst. U.S. Pat. No. 5,853,808 describes that silsesquioxane polymers that are useful for preparing $SiO_2$- rich ceramic coatings can be obtained as the polymeric reaction products from the hydrolysis and condensation of organosilanes having a β-substituted alkyl group.

However, the prior polysilsesquioxane resins have not accomplished very low dielectric constant that is currently required for insulating film between interconnect layers in semiconductor devices. Additionally, they have been required to improve in mechanical properties, thermal stability, crack-resistance, and so on.

SUMMARY OF THE INVENTION

A feature of the present invention is a method for forming low dielectric insulating film between interconnect layers in semiconductor devices by using a siloxane-based resin having very low dielectric constant, wherein the resin is obtained from the copolymerization of cyclic and/or cage-shape siloxane compounds optionally with one or more silane compounds.

An aspect of the present invention relates to siloxane-based resins that are prepared by hydrolyzing and polycondensing a cyclic siloxane compound of formula (1) and a cage-shape siloxane compound of any of formulas (2a)–(2c) in an organic solvent in the presence of a catalyst and water:

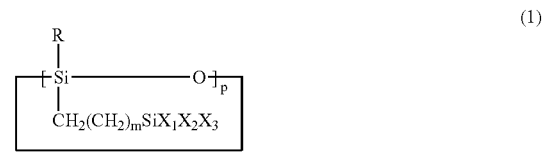

wherein,

R is H, $C_{1-3}$ alkyl, $C_{3-10}$ cycloalkyl, or $C_{6-15}$ aryl;

each of $X_1$, $X_2$, and $X_3$ is, independently, $C_{1-3}$ alkyl, $C_{1-10}$ alkoxy, or halo, provided that at least one is alkoxy or halo;

p is an integer from 3 to 8; and m is an integer from 1 to 10;

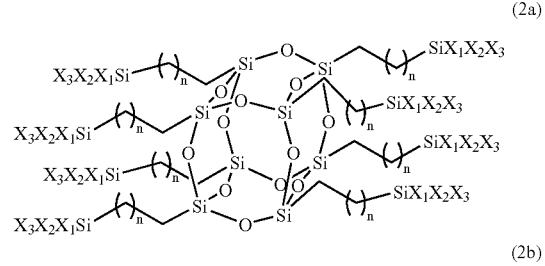

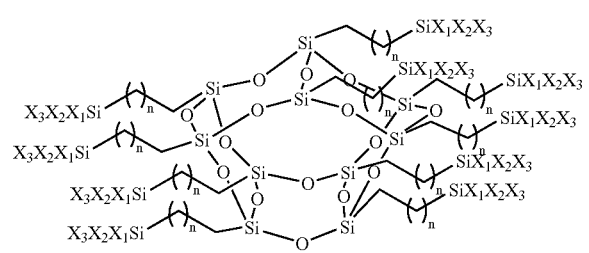

-continued (2c)

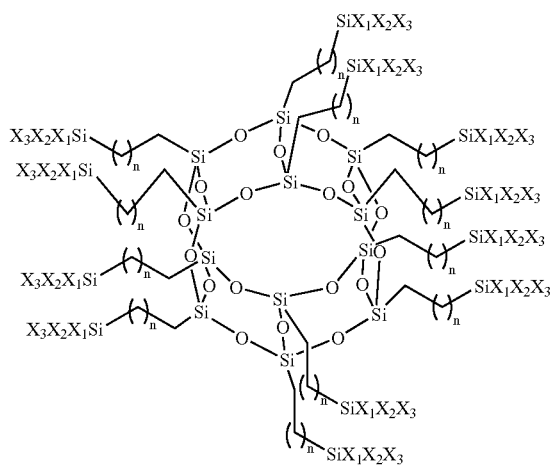

in the above formulas (2a)–(2c), each of $X_1$, $X_2$, and $X_3$ is, independently, $C_{1-3}$ alkyl, $C_{1-10}$ alkoxy, or halo, provided that at least one is alkoxy or halo; and n is an integer from 1 to 12.

Another aspect of the present invention relates to siloxane-based resins that are prepared by hydrolyzing and polycondensing a cyclic siloxane compound of formula (1) and a cage-shape siloxane compound of any of formulas (2a)–(2c), together with a silane compound of formula (3) and/or a silane compound of formula (4), in an organic solvent in the presence of a catalyst and water:

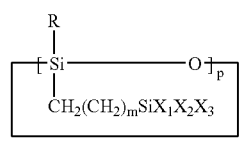
(1)

wherein,

R is H, $C_{1-3}$ alkyl, $C_{3-10}$ cycloalkyl, or $C_{6-15}$ aryl;

each of $X_1$, $X_2$, and $X_3$ is, independently, $C_{1-3}$ alkyl, $C_{1-10}$ alkoxy, or halo, provided that at least one is alkoxy or halo;

p is an integer from 3 to 8; and m is an integer from 1 to 10;

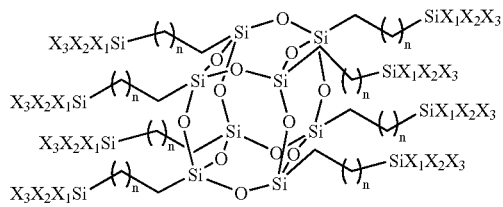
(2a)

-continued

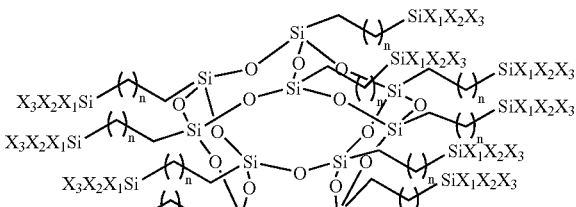
(2b)

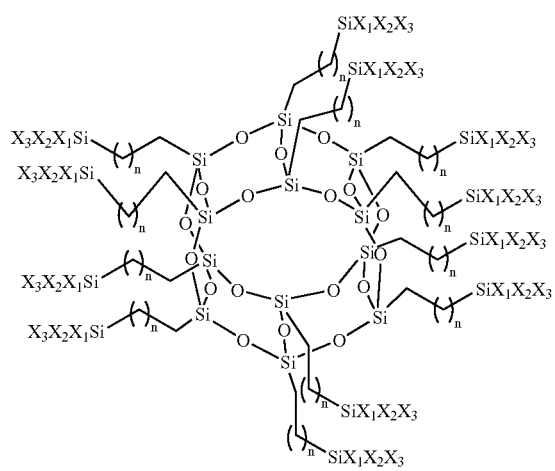
(2c)

in the above formulas 2(a)–2(c), each of $X_1$, $X_2$, and $X_3$ is, independently, $C_{1-3}$ alkyl, $C_{1-10}$ alkoxy, or halo, provided that at least one is alkoxy or halo; and n is an integer from 1 to 12;

$$SiX_1X_2X_3X_4 \quad (3)$$

wherein, each of $X_1$, $X_2$, $X_3$, and $X_4$ is, independently, $C_{1-10}$ alkoxy, or halo;

$$RSiX_1X_2X_3 \quad (4)$$

wherein,

R is H, $C_{1-3}$ alkyl, $C_{3-10}$ cycloalkyl, or $C_{6-15}$ aryl; and each of $X_1$, $X_2$, and $X_3$ is, independently, $C_{1-3}$ alkyl, $C_{1-10}$ alkoxy, or halo, provided that at least one is alkoxy or halo.

Still another aspect of the present invention relates to siloxane-based resins that are prepared by hydrolyzing and polycondensing a cyclic siloxane compound of formula (1), together with a silane compound of formula (3) and/or a silane compound of formula (4), in an organic solvent in the presence of a catalyst and water:

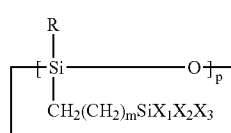
(1)

wherein,

R is H, $C_{1-3}$ alkyl, $C_{3-10}$ cycloalkyl, or $C_{6-15}$ aryl;

each of $X_1$, $X_2$, and $X_3$ is, independently, $C_{1-3}$ alkyl, $C_{1-10}$ alkoxy, or halo, provided that at least one is alkoxy or halo;

p is an integer from 3 to 8; and m is an integer from 1 to 10;

$$SiX_1X_2X_3X_4 \qquad (3)$$

wherein, each of $X_1$, $X_2$, $X_3$, and $X_4$ is, independently, $C_{1-10}$ alkoxy, or halo;

$$RSiX_1X_2X_3 \qquad (4)$$

wherein,

R is H, $C_{1-3}$ alkyl, $C_{3-10}$ cycloalkyl, or $C_{6-15}$ aryl; and each of $X_1$, $X_2$, and $X_3$ is, independently, $C_{1-3}$ alkyl, $C_{1-10}$ alkoxy, or halo, provided that at least one is alkoxy or halo.

Still another aspect of the present invention relates to siloxane-based resins that are prepared by hydrolyzing and polycondensing a cage-shape siloxane compound of any of formulas (2a)–(2c), together with a silane compound of formula (3) and/or a silane compound of formula (4), in an organic solvent in the presence of a catalyst and water:

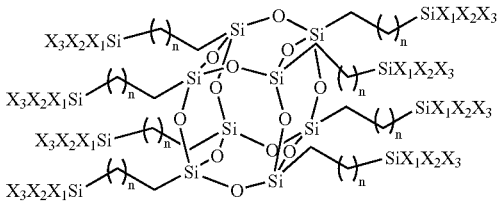

(2a)

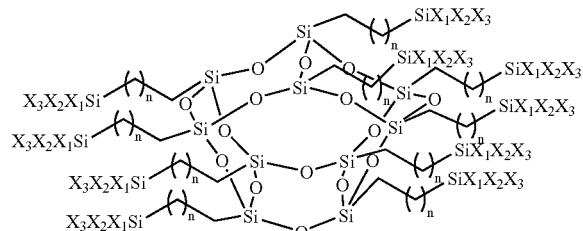

(2b)

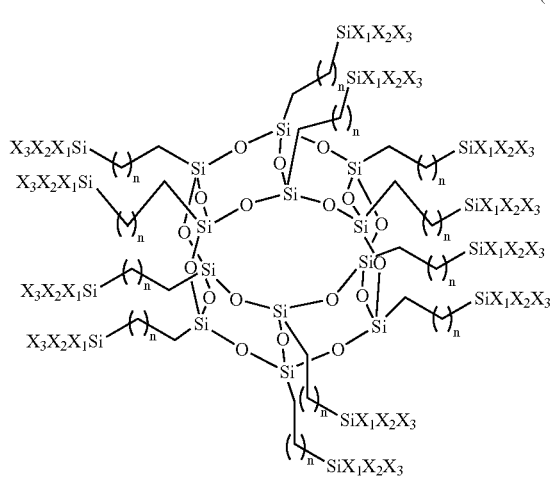

(2c)

in the above formulas (2a)–(2c), each of $X_1$, $X_2$, and $X_3$ is, independently, $C_{1-3}$ alkyl, $C_{1-10}$ alkoxy, or halo, provided that at least one is alkoxy or halo; and n is an integer from 1 to 12;

$$SiX_1X_2X_3X_4 \qquad (3)$$

wherein, each of $X_1$, $X_2$, $X_3$, and $X_4$ is, independently, $C_{1-10}$ alkoxy, or halo;

$$RSiX_1X_2X_3 \qquad (4)$$

wherein,

R is H, $C_{1-3}$ alkyl, $C_{3-10}$ cycloalkyl, or $C_{6-15}$ aryl; and each of $X_1$, $X_2$, and $X_3$ is, independently, $C_{1-3}$ alkyl, $C_{1-10}$ alkoxy, or halo, provided that at least one is alkoxy or halo.

Still another aspect of the present invention relates to a method for forming insulating film between interconnect layers in semiconductor devices, the method comprising the steps of: providing a resinous solution by dissolving the siloxane-based resin described above in an organic solvent; coating a silicon wafer with the resinous solution; and heat-curing the resulting coating film.

All of the above features and other features of the present invention will be successfully achieved from the present invention described in the following.

DETAILED DESCRIPTION OF THE INVENTION

The Priority Korean Patent Application Nos. 2001-15884 filed on Mar. 27, 2001 and 2001-56798 filed on Sep. 14, 2001 are hereby incorporated in their entirety by reference.

A siloxane-based resin of the present invention is prepared by hydrolyzing and polycondensing cyclic and/or cage-shape siloxane monomers, optionally with at least one silane monomer, in an organic solvent in the presence of a catalyst and water.

The cyclic siloxane monomers used in the present invention can be represented by the following formula (1):

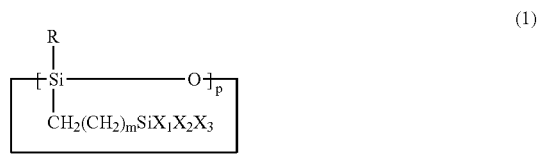

(1)

wherein,

R is H, $C_{1-3}$ alkyl, $C_{3-10}$ cycloalkyl, or $C_{6-15}$ aryl;

each of $X_1$, $X_2$, and $X_3$ is, independently, $C_{1-3}$ alkyl, $C_{1-10}$ alkoxy, or halo, provided that at least one is alkoxy or halo;

p is an integer from 3 to 8; and m is an integer from 1 to 10.

As can be seen from the above formula (1), two silicon atoms are linked to each other through an oxygen atom to form cyclic structure, and the terminal of each branch comprises at least one hydrolysable group. These cyclic siloxane monomers, for example, may be obtained from a hydrosilation reaction using a metal catalyst.

The cage-shape siloxane monomers used in the present invention can be represented by one of the following formulas (2a)–(2c):

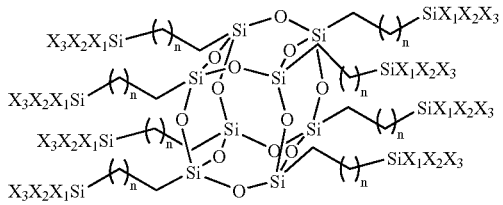
(2a)

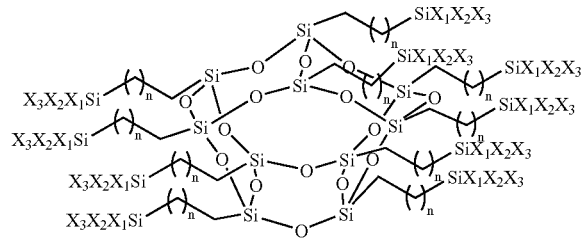
(2b)

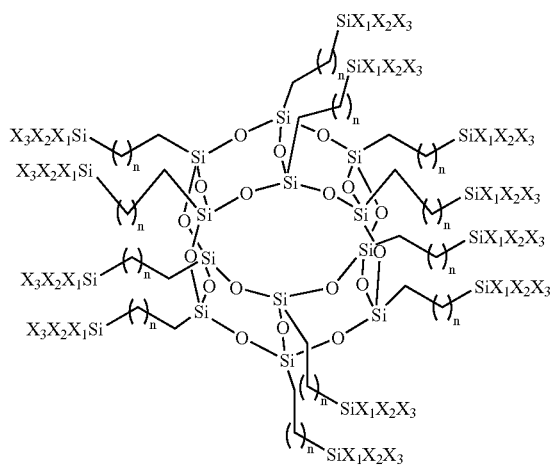
(2c)

in the above formulas (2a)–(2c), each of $X_1$, $X_2$, and $X_3$ is, independently, $C_{1-3}$ alkyl, $C_{1-10}$ alkoxy, or halo, provided that at least one is alkoxy or halo; and n is an integer from 1 to 12.

As can be seen from the above formulas (2a)–(2c), two silicon atoms are linked to each other through an oxygen atom to form cyclic structure, and the terminal of each branch comprises at least one hydrolysable group.

As the cage-shape siloxane monomers, commercially available ones whose terminal functional groups are halogens can be used, without modification or after substitution of the terminal halogens with alkyl and/or alkoxy groups. Such substitution may be accomplished by any of standard methods well known in the art. For example, the substitution of the terminal halogens with alkoxy groups can be readily accomplished through reacting the halogenated cage-shape siloxane compound with an alcohol and a triethylamine.

On the other hand, the silane monomers used in the present invention can be represented by the following formula (3), in which Si has four hydrolysable substituents:

$$SiX_1X_2X_3X_4 \quad (3)$$

wherein, each of $X_1$, $X_2$, $X_3$, and $X_4$ is, independently, $C_{1-10}$ alkoxy, or halo.

Non-limiting examples of such silane monomer include tetra-n-butoxysilane, tetra-n-propoxysilane, tetraethoxysilane, tetramethoxysilane, tetrachlorosilane, tetrabromosilane, tetrafluorosilane, triethoxychlorosilane, and trimethoxychlorosilane.

Also, the other silane monomers represented by the following formula (4) can be used in the preparation of the siloxane-based resins of the present invention, in which Si has at least one hydrolysable substituent:

$$RSiX_1X_2X_3 \quad (4)$$

wherein,

R is H, $C_{1-3}$ alkyl, $C_{3-10}$ cycloalkyl, or $C_{6-15}$ aryl; and each of $X_1$, $X_2$, and $X_3$ is, independently, $C_{1-3}$ alkyl, $C_{1-10}$ alkoxy, or halo, provided that at least one is alkoxy or halo.

Non-limiting examples of such silane monomer include methyltriethoxysilane, methyltrimethoxysilane, methyltri-n-propoxysilane, phenyltrimethoxysilane, phenyltriethoxysilane, phenyltrichlorosilane, phenyltrifluorosilane, methyltrichlorosilane, methyltribromosilane, methyltrifluorosilane, triethoxysilane, trimethoxysilane, trichlorosilane, and trifluorosilane.

The siloxane-based resins of the present invention can be obtained as copolymeric products from the hydrolysis and polycondensation of the cyclic siloxane compound of formula (1) (hereinafter, referred to as siloxane compound (1)) and the cage-shape siloxane compound of formula (2) (hereinafter, referred to as siloxane compound (2)) in an organic solvent in the presence of a catalyst and water. Alternatively, the siloxane-based resins of the present invention can be prepared by hydrolyzing and polycondensing either or both of siloxane compounds (1) and (2), together with either or both of the silane compound of formula (3) (hereinafter, referred to as silane compound (3)) and the silane compound of formula (4) (hereinafter, referred to as silane compound (4)), in an organic solvent in the presence of a catalyst and water.

For the preparation of a binary copolymer from siloxane compounds (1) and (2), the molar ratio of compound (1) vs. compound (2) is between 0.1:99.9 and 99.9:0.1, preferably 5:95 and 50:50.

On the other hand, for the preparation of a ternary copolymer from both siloxane compounds (1) and (2), in conjunction with either silane compound (3) or (4), an amount of each compound ranges from 1 to 98 mol %, respectively.

Moreover, a quaternary copolymer can be prepared by using both silane compounds (3) and (4) in conjunction with both siloxane compounds (1) and (2). At this time, each of the four compounds is used in an amount of 1–97 mol %, respectively.

In the present invention, as siloxane monomers, both cyclic and cage-shape siloxane compounds are not always used in combination, and thus it is also possible to use either of the cyclic and cage-shape siloxane compounds.

Where cyclic siloxane compound (1) is solely used as a siloxane monomer, silane compound (3) is preferably copolymerized therewith to provide a binary copolymer, wherein the molar ratio of compound (1) vs. compound (3) is between 99.9:0.1 and 0.1:99.9, preferably 95:5 and 50:50. Alternatively, silane compound (4) can be additionally employed in the copolymerization to provide a ternary copolymer. This ternary copolymer contains 1–98 mol % of compound (1), 1–98 mol % of compound (3), and 1–98 mol % of compound (4).

Similarly, where cage-shape siloxane compound (2) is solely used as a siloxane monomer, silane compound (4) is preferably copolymerized therewith to provide a binary copolymer, wherein the molar ratio of compound (2) vs. compound (4) is between 0.1:99.9 and 99.9:0.1, preferably 5:95 and 50:50. Alternatively, silane compound (3) can be further added to the copolymerization reaction to provide a ternary copolymer. This ternary copolymer contains 1–98 mol % of compound (2), 1–98 mol % of compound (3), and 1–98 mol % of compound (4).

As the organic solvents used in the preparation of the siloxane-based resins according to the present invention, aromatic hydrocarbon solvent, aliphatic hydrocarbon solvent, ketone-based solvent, ether-based solvent, acetate-based solvent, alcohol-based solvent, silicon-based solvent, or mixtures thereof are preferred.

Exemplary catalysts used in the present invention include, without limitation, hydrochloric acid, nitric acid, benzene sulfonic acid, oxalic acid, formic acid, potassium hydroxide, sodium hydroxide, triethylamine, sodium bicarbonate, pyridine, and mixtures thereof.

In the hydrolysis and polycondensation reaction according to the present invention, the molar ratio of the catalyst vs. monomers to be polymerized (inclusive of siloxane and silane compounds) is preferably between 0.00001:1 and 10:1. Further, 0.1–1,000 mol of water is added to 1 mol of the monomers. Then, the hydrolysis and polycondensation are carried out at a temperature of 0–200° C., preferably 50–110°C., for 0.1–100 hrs, preferably 3–48 hrs.

The siloxane-based resins thus prepared have Mw of 3,000 to 500,000, preferably 3,000 to 100,000. Preferably, Si—OR content in the whole terminal groups represented by Si—OR and/or Si—R is more than 5 mol %, wherein R is H, $C_{1-3}$ alkyl, $C_{3-10}$ cycloalkyl, or $C_{6-15}$ aryl. The siloxane-based resins of the present invention can be used as matrix precursors of insulating film between interconnect layers in semiconductor devices.

Particular method for forming insulating film between interconnect layers in semiconductor devices by using the siloxane-based resins according to the present invention is described below.

As mentioned above, a method for forming insulating film between interconnect layers in semiconductor devices of the present invention comprises the steps of: providing a resinous solution by dissolving the siloxane-based resin in an organic solvent; coating a silicon wafer with the resinous solution; and heating the coated wafer to cure the resin.

According to the present invention, the resinous solution can further comprise a porogen, which is a pore-generating material. Non-limiting examples of the porogen useful in the present invention include cyclodextrin and derivatives thereof described in Korean Patent Appln. No. 2001-15883, as well as polycaprolactone and derivatives thereof described in U.S. Pat. No. 6,114,458. Preferred mixing ratio of the siloxane-based resin vs. porogen is between 99:1 and 30:70 (w/w), more preferably 90:10 and 50:50 (w/w).

Preferred organic solvents used in dissolution of the siloxane-based resin or a mixture of the siloxane-based resin and porogen to provide a resinous solution can be exemplified by, but are not limited to, aliphatic hydrocarbon solvents; aromatic hydrocarbon solvents such as anisole, mesitylene and xylene; ketone-based solvents such as methyl isobutyl ketone, 1-methyl-2-pyrrolidinone, cyclohexanone and acetone; ether-based solvents such as tetrahydrofuran and isopropyl ether; acetate-based solvents such as ethyl acetate, butyl acetate and propylene glycol methyl ether acetate; alcohol-based solvents such as isopropyl alcohol, butyl alcohol and octyl alcohol; amide-based solvents such as dimethylacetamide and dimethylformamide; silicon-based solvents; and mixtures thereof Upon preparing a resinous solution, the organic solvent should be used in a sufficient amount to apply the resin component evenly on the surface of a wafer. Thus, the organic solvent is added to the siloxane-based resin or to the mixture of the siloxane-based resin and porogen so that final concentration of the solid matter (inclusive of the siloxane-based resin and the porogen) is 0.1–80 wt %, preferably 5–40 wt %.

Non-limiting examples of the method for coating a silicon wafer with the resinous solution thus prepared include spin-coating, dip-coating, spray-coating, flow-coating, and screen-printing, while spin-coating is most preferred. For spin coating, the spin rate is controlled to be between 1,000 and 5,000 rpm.

After the coating, the organic solvent is evaporated from the wafer so that a resinous film comprising the siloxane-based resin can deposit on the wafer. At this time, the evaporation may be carried out by simple air-drying, or by subjecting the wafer, at the beginning of following curing step, to a vacuum condition or mild heating ($\leq 100°$ C.).

Subsequently, the resinous film is cured by heating for 1–150 min at a temperature of 150–600° C., preferably 200–450° C., so as to provide a insoluble, crack-free film. As used herein, by "crack-free film" is meant a film without any crack observed with an optical microscope at a magnification of 1000×. As used herein, by "insoluble film" is meant a film that is substantially insoluble in any solvent described as being useful for dissolving the siloxane-based resins.

The coating film thus formed was found to have dielectric constant below 3.0, preferably between 2.0 and 2.7, and so it is very useful as an insulating film between interconnect layers in semiconductor devices.

The present invention can be more clearly understood with referring to the following examples. It should be understood that the following examples are not intended to restrict the scope of the present invention in any manner.

PRODUCTION EXAMPLE 1

Synthesis of Cyclic Siloxane Monomers

PRODUCTION EXAMPLE 1-1

Synthesis of Monomer (A)

To a flask were added 10.0 g (29.014 mmol) of 2,4,6,8-tetramethyl-2,4,6,8-tetravinylcyclotetrasiloxane and 0.164 g of platinum(O)-1,3-divinyl-1,1,3,3-tetramethyldisiloxane complex (solution in xylene), and then diluted with 300 ml of diethylether. Next, the flask was cooled to −78° C., 17.29 g (127.66 mmol) of trichlorosilane was slowly added thereto, and then it was slowly warmed to room temperature. The reaction was continued at room temperature for 20 hrs, and volatile materials were removed from the reaction mixture under a reduced pressure of about 0.1 Torr. To the mixture was added 100 ml of pentane and stirred for 1 hr, and then the mixture was filtered through celite. From the filtrate was evaporated pentane under a reduced pressure of about 0.1 Torr to afford a liquid compound represented by the following formula:

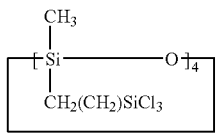

10.0 g (11.28 mmol) of the liquid compound was diluted with 500 ml of tetrahydrofuran, and 13.83 g (136.71 mmol) of triethylamine was added thereto. Thereafter, the mixture was cooled to −78° C., 4.38 g (136.71 mmol) of methyl alcohol was slowly added thereto, and then it was slowly warmed to room temperature. The reaction was continued at room temperature for 15 hrs and filtered through celite, and then volatile materials were evaporated from the filtrate under a reduced pressure of about 0.1 Torr. Subsequently, 100 ml of pentane was added to the filtrate and stirred for 1 hr, and then the mixture was filtered through celite to provide a clear colorless solution. Finally, pentane was evaporated from this solution under a reduced pressure of about 0.1 Torr to afford monomer (A) represented by the following formula:

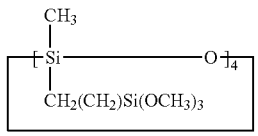

The results obtained from NMR analysis of monomer (A) dissolved in $CDCl_3$ are as follows:

$^1$H-NMR (300 MHz): δ 0.09(s, 12H, 4×—$CH_3$), 0.52~0.64(m, 16H, 4×—$CH_2CH_2$—), 3.58(s, 36H, 4×—$[OCH_3]_3$)

PRODUCTION EXAMPLE 1-2

Synthesis of Monomer (B)

To a flask were added 2.0 g (8.32 mmol) of 2,4,6,8-tetramethylcyclotetrasiloxane and 0.034 g of platinum(O)-1,3-divinyl-1,1,3,3-tetramethyldisiloxane complex (solution in xylene), and then diluted with 100 ml of toluene, followed by addition of 7.75 g (33.36 mmol) of trimethoxy(7-octene-1-yl)silane. Next, the flask was slowly warmed to 75° C. The reaction was continued at 75° C. for 36 hrs, and then volatile materials were removed therefrom under a reduced pressure of about 0.1 Torr. To the reaction mixture was added 100 ml of pentane and stirred for 1 hr, and then the mixture was filtered through celite. Subsequently, pentane was evaporated from the filtrate under a reduced pressure of about 0.1 Torr to afford monomer (B) represented by the following formula:

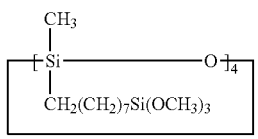

The results obtained from NMR analysis of monomer (B) dissolved in $CDCl_3$ are as follows:

$^1$H-NMR (300 MHz): δ 0.11(s, 12H, 4×—$CH_3$), 0.48~0.53(m, 8H, 4×—$CH_2$—), 0.86~0.90(m, 8H, 4×—$CH_2$—), 1.15~1.71(m, 48H, 4×—$[CH_2]_6$), 3.58(s, 36H, 4×—$[OCH_3]_3$)

PRODUCTION EXAMPLE 2

Synthesis of Cage-Shape Siloxane Monomers

PRODUCTION EXAMPLE 2-1

Synthesis of Monomer (C)

To a flask was added 10.0 g (7.194 mmol) of octa(chlorosilylethyl)-POSS[ Polyhedral Oligomeric Silsesquioxane] and diluted with 500 ml of tetrahydrofuran, followed by addition of 6.41 g (63.310 mmol) of triethylamine. Next, the flask was cooled to −78° C., and 2.03 g (63.310 mmol) of methyl alcohol was slowly added thereto, and then it was slowly warmed to room temperature. The reaction was continued at room temperature for 20 hrs, filtered through celite, and then volatile materials were evaporated from the filtrate under a reduced pressure of about 0.1 Torr. Subsequently, 100 ml of pentane was added to the filtrate and stirred for 1 hr, and then the mixture was filtered through celite to provide a clear colorless solution. Finally, pentane was evaporated from this solution under a reduced pressure of about 0.1 Torr to afford monomer (C) represented by the following formula:

CH₃O(CH₃)₂Si— … —Si(CH₃)₂OCH₃ (cage-shape POSS structure with eight —Si(CH₃)₂OCH₃ arms)

The results obtained from NMR analysis of monomer (C) dissolved in $CDCl_3$ are as follows:

$^1$H-NMR (300 MHz): δ 0.11(s, 48H, 8×—$[CH_3]_2$), 0.54~0.68(m, 32H, 8×—$CH_2CH_2$—), 3.43(s, 24H, 8×—$OCH_3$)

PRODUCTION EXAMPLE 2-2

Synthesis of Monomer (D)

To a flask was added 10.0 g (6.438 mmol) of octa(dichlorosilylethyl)-POSS and diluted with 500 ml of tetrahydrofuran, followed by addition of 11.47 g (113.306 mmol) of triethylamine. Next, the flask was cooled to −78° C., and 3.63 g (113.306 mmol) of methyl alcohol was slowly added thereto, and then it was slowly warmed to room temperature. The reaction was continued at room temperature for 20 hrs, filtered through celite, and then volatile materials were evaporated from the filtrate under a reduced pressure of about 0.1 Torr. Subsequently, 100 ml of pentane was added to the filtrate and stirred for 1 hr, and the mixture was filtered through celite to provide a clear colorless solution. Finally, pentane was evaporated from this solution under a reduced pressure of about 0.1 Torr to afford monomer (D) represented by the following formula:

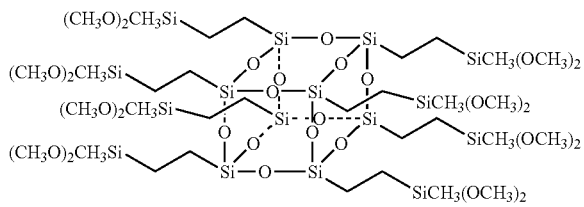

The results obtained from NMR analysis of monomer (D) dissolved in $CDCl_3$ are as follows:

$^1$H-NMR (300 MHz): δ 0.12(s, 24H, 8×—$CH_3$), 0.56~0.70(m, 32H, 8×—$CH_2CH_2$—), 3.46(s, 48H, 8×—$[OCH_3]_2$)

PRODUCTION EXAMPLE 2-3

Synthesis of Monomer (E)

To a flask was added 5.0 g (2.913 mmol) of octa(trichlorosilylethyl)-POSS and diluted with 500 ml of tetrahydrofuran, followed by addition of 7.78 g (76.893 mmol) of triethylamine. Next, the flask was cooled to −78° C., and 2.464 g (76.893 mmol) of methyl alcohol was slowly added thereto, and then it was slowly warmed to room temperature. The reaction was continued at room temperature for 20 hrs, filtered through celite, and then volatile materials were evaporated from the filtrate under a reduced pressure of about 0.1 Torr. Subsequently, 100 ml of pentane was added to the filtrate and stirred for 1 hr, and then the mixture was filtered through celite to provide a clear colorless solution. Finally, pentane was evaporated from this solution under a reduced pressure of about 0.1 Torr to afford monomer (E) represented by the following formula:

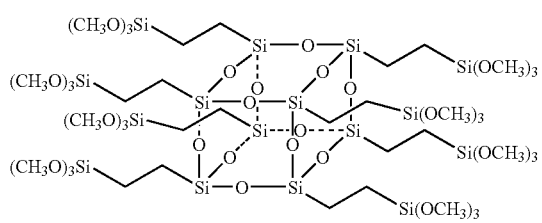

The results obtained from NMR analysis of monomer (E) dissolved in $CDCl_3$ are as follows:

$^1$H-NMR (300 MHz): δ 0.66~0.69(m, 32H, 8×—$CH_2CH_2$—), 3.58(s, 72H, 8×—$[OCH_3]_3$)

EXAMPLE 1

Synthesis of Siloxane-Based Resins

EXAMPLE 1-1

Copolymerization of Cyclic and Cage-Shape Siloxane Monomers

Cyclic and cage-shape siloxane monomers were quantified respectively according to Table 1, and then added to a flask, followed by dilution with 45 ml of tetrahydrofuran. Thereafter, the flask was cooled to −78° C., and HCl and deionized water were slowly added thereto at the same temperature, and then it was slowly warmed to 70° C. The reaction was continued at 70° C. for 16 hrs, and transferred to a separatory funnel, followed by addition of 90 ml of diethylether. After washing with 3 ×50 ml of deionized water, volatile materials were evaporated from the remaining solution to afford a white powdery polymer. The powder was dissolved in a small amount of acetone, and filtered through a 0.2 μm syringe filter so as to remove impurities to provide a clear filtrate. After addition of water to the filtrate, the resulting white powder was separated from the liquid phase (mixed solution of acetone and water), and then dried at a temperature of 0–5° C. under a reduced pressure of about 0.1 Torr to afford a fractionated siloxane-based resin.

TABLE 1

| | Monomers | | | | |
|---|---|---|---|---|---|
| Resin | Cyclic siloxane | Cage-shape siloxane | HCl (mmol) | $H_2O$ (mmol) | Yield (g) |
| (a) | Monomer (A) 13.294 mmol | Monomer (C) 1.476 mmol | 1.713 | 570.96 | 6.15 |
| (b) | Monomer (A) 12.142 mmol | Monomer (D) 1.349 mmol | 1.673 | 557.56 | 6.04 |
| (c) | Monomer (B) 12.136 mmol | Monomer (D) 1.349 mmol | 1.673 | 557.56 | 5.17 |
| (d) | Monomer (A) 11.183 mmol | Monomer (E) 1.242 mmol | 1.640 | 546.70 | 4.11 |

EXAMPLE 1-2

Copolymerization of Cyclic and Cage-Shape Siloxane Monomers together with a Silane Monomer of Formula (3)

Cyclic and cage-shape siloxane monomers as well as tetramethoxysilane as a silane monomer of formula (3) were quantified respectively according to Table 2, and then added to a flask, followed by dilution with 50 ml of tetrahydrofuran. Thereafter, the flask was cooled to −78° C., and HCl and deionized water were slowly added thereto at the same temperature, and then it was slowly warmed to 60° C. The reaction was continued at 60° C. for 16 hrs, and transferred to a separatory funnel, followed by addition of 150 ml of diethylether. After washing with 3×50 ml of deionized water, volatile materials were evaporated from the remaining solution to afford a white powdery polymer. The powder was dissolved in a small amount of acetone, and filtered through a 0.2 μm syringe filter so as to remove impurities to provide a clear filtrate. After addition of water to the filtrate, the resulting white powder was separated from the liquid phase (mixed solution of acetone and water), and then dried at a temperature of 0–5° C. under a reduced pressure of about 0.1 Torr to afford a fractionated siloxane-based resin.

TABLE 2

| Resin | Monomers (mmol) | | | HCl (mmol) | H₂O (mmol) | Yield (g) |
| --- | --- | --- | --- | --- | --- | --- |
| | Cyclic siloxane Monomer (A) | Cage-shape siloxane Monomer (C) | Silane Tetramethoxysilane | | | |
| (e) | 10.799 | 1.200 | 5.144 | 1.598 | 532.494 | 5.37 |

EXAMPLE 1-3

Copolymerization of Cyclic and Cage-Shape Siloxane Monomers together with Silane Monomers of Formulas (3) and (4)

The procedure of Example 1-3 was conducted according to the same manner as in the above Example 1-2, except that methyltrimethoxysilane was additionally used as a silane monomer of formula (4).

TABLE 3

| Resin | Monomers (mmol) | | | | HCl (mmol) | H₂O (mmol) | Yield (g) |
| --- | --- | --- | --- | --- | --- | --- | --- |
| | Cyclic siloxane Monomer (A) | Cage-shape siloxane Monomer (C) | Silane | | | | |
| | | | Tetramethoxy-silane | Methyltrimethoxy-silane | | | |
| (f) | 9.598 | 1.200 | 5.144 | 1.197 | 1.490 | 496.428 | 4.76 |

EXAMPLE 1-4

Copolymerization of a Cyclic Siloxane Monomer together with a Silane Monomer of Formula (3)

The procedure of Example 1-4 was conducted according to the same manner as in the above Example 1-2, except that the cage shape siloxane monomer was omitted.

TABLE 4

| Resin | Monomers (mmol) | | HCl (mmol) | H₂O (mmol) | Yield (g) |
| --- | --- | --- | --- | --- | --- |
| | Cyclic siloxane Monomer (A) | Silane Tetramethoxysilane | | | |
| (g) | 5.999 | 0.667 | 0.747 | 248.828 | 2.39 |
| (h) | 5.999 | 2.571 | 0.823 | 274.213 | 2.46 |
| (i) | 5.999 | 5.999 | 0.960 | 319.915 | 2.53 |

EXAMPLE 1-5

Copolymerization of a Cyclic Siloxane Monomer together with Silane Monomers of Formulas (3) and (4)

The procedure of Example 1-5 was conducted according to the same manner as in the above Example 1-4, except that methyltrimethoxysilane was additionally used as a silane monomer of formula (4).

TABLE 5

| Resin | Monomers (mmol) | | | HCl (mmol) | H₂O (mmol) | Yield (g) |
| --- | --- | --- | --- | --- | --- | --- |
| | Cyclic siloxane Monomer (A) | Silane | | | | |
| | | Tetramethoxy-Silane | Methyltrimethoxy-silane | | | |
| (j) | 10.799 | 5.144 | 1.197 | 1.538 | 512.466 | 5.04 |

EXAMPLE 1-6

Copolymerization of a Cage-Shape Siloxane Monomer together with a Silane Monomer of Formula (4)

The procedure of Example 1-6 was conducted according to the same manner as in the above Example 1-1, except that a silane monomer of formula (4), methyltrimethoxysilane was used instead of the cyclic siloxane monomer.

TABLE 6

| Resin | Monomers Cage-shape siloxane | Silane | HCl (mmol) | $H_2O$ (mmol) | Yield (g) |
|---|---|---|---|---|---|
| (k) | Monomer (C) 1.476 mmol | Methyl-trimethoxysilane 13.287 mmol | 0.00517 | 172.36 | 2.03 |
| (l) | Monomer (D) 1.349 mmol | Methyl-trimethoxysilane 12.113 mmol | 0.00580 | 193.36 | 1.95 |

EXAMPLE 2

Analysis of the Composition of Resins

The respective siloxane-based resins obtained from the above Examples 1-1 through 1-6 were analyzed for weight average molecular weight (hereinafter, referred to as "Mw"), molecular weight distribution (hereinafter, referred to as "MWD"), weight loss, and contents of Si—OH, Si—OCH$_3$ and Si—CH$_3$, as described below. The results are set forth in Table 7.

TABLE 7

| Resin | MW | MWD | Si—OH (%) | Si—OCH$_3$ (%) | Si—CH$_3$ (%) | Weight loss (%) |
|---|---|---|---|---|---|---|
| (a) | 63418 | 6.13 | 26.3 | 0.7 | 73.0 | 4.5 |
| (b) | 66614 | 8.59 | 37.6 | 0.6 | 61.8 | 4.1 |
| (c) | 89860 | 8.34 | 39.7 | 0.8 | 59.5 | 3.8 |
| (d) | 67145 | 7.86 | 28.6 | 1.7 | 69.7 | 3.7 |
| (e) | 60452 | 8.70 | 17.2 | 0.8 | 82.0 | N.D.[1] |
| (f) | 54213 | 7.86 | 21.6 | 2.0 | 76.4 | N.D. |
| (g) | 29316 | 7.85 | 35.1 | 1.3 | 63.6 | N.D. |
| (h) | 26778 | 7.46 | 37.1 | 1.5 | 61.4 | N.D. |
| (i) | 19904 | 6.30 | 27.1 | 1.5 | 71.4 | N.D. |
| (j) | 23654 | 6.53 | 28.3 | 1.9 | 69.8 | N.D. |
| (k) | 6878 | 6.15 | 12.9 | 0.9 | 86.2 | 4.2 |
| (l) | 6904 | 5.70 | 30.6 | 1.4 | 68.0 | 4.6 |

[1]N.D.: not determined

[Analytical Methods]
Mw and MWD: analyzed by gel permeation chromatography (Waters Co.)
Si—OH, Si—OCH$_3$ and Si—CH$_3$ contents (%): analyzed by NMR (Bruker Co.)

Si—OH(%)=Area(Si—OH)/[Area(Si—OH)+Area(Si—OCH$_3$)+Area(Si—CH$_3$)]×100

Si—OCH$_3$(%)=Area(Si—OCH$_3$)/[Area(Si—OH)+Area(Si—OCH$_3$)+Area(Si—CH$_3$)]×100

Si—CH$_3$(%)=Area(Si—CH$_3$)/[Area(Si—OH)+Area(Si—OCH$_3$)+Area(Si—CH$_3$)]×100

Weight loss(%): analyzed by a thermogravimetric analyzer (TA instruments Co.)

EXAMPLE 3

Measurement of Thickness, Refractive Index and Dielectric Constant of Resinous Films With or without being mixed with a porogen, heptakis(2,3,6-tri-O-methyl)-β-cyclodextrin in a mixing ratio by weight according to Table 8, each of the siloxane-based resins obtained from the above Examples 1-1 through 1-6 was dissolved, respectively, in either methylisobutylketone (MIBK) or propylene glycol methyl ether acetate (PGMEA), so that final concentration of the solid matter (inclusive of the resin and the porogen) in the resulting resinous solution amounted to 25 wt. %. The resinous solution was spin-coated onto a silicon wafer for 30 sec with maintaining the spin rate of 3,000 rpm. Under a nitrogen atmosphere, the coated wafer was subjected to sequential soft baking on a hot plate for 1 min at either 100° C. (for resin e, f, g, h, i, j) or 150° C.(for resin a, b, c, d, k, l) and for another minute at 250° C., to remove the organic solvent sufficiently. Thereafter, the temperature of the wafer was elevated to either 400° C. (for resin a, b, c, d, k, l) or 420° C. (for resin e, f, g, h, i, j) at a rate of 3° C./min under vacuum condition, and then the wafer was cured at the same temperature for 1 hr to afford a test piece.

Each of the test pieces thus prepared was analyzed for film thickness by using a prism coupler, an ellipsometer, and a profiler. Also, dielectric constant of the film was determined by using Hg CV meter (SSM 490i CV system, Solid State Measurements), at a frequency of approximately 1 MHz in the gate voltage range of −220V through 220V as follows. Capacitance of a control piece coated with a reference material (e.g. thermal silicon oxide), whose film thickness and dielectric constant had been previously determined, was first measured. Then, contact area between a Hg electrode and the control piece was calculated from the following equation (1) and set down as a reference value:

$$A = C \times t / k \qquad (1)$$

(wherein, "A" is the contact area between the Hg electrode and the control piece, "C" is the capacitance of the control piece measured above, "t" is the film thickness of the control piece, and "k" is the dielectric constant of the reference material (3.9 for thermal silicon oxide used herein).

Once capacitance of the test piece is found out from C-V measurement by using the Hg CV meter, film thickness of the test piece corresponding to the reference dielectric constant k=3.9, based on the capacitance and the reference "A", is determined from the above equation (1), and hereinafter referred to as "conversion thickness". Subsequently, the conversion thickness ($t_{conv.}$) and the real film thickness ($t_{test\ piece}$) of the test piece, which was previously determined as described above, are substituted into the following equation (2), to provide dielectric constant "k" of the test piece:

$$k_{test\ piece} = 3.9 \times t_{test\ piece} / t_{conv.} \qquad (2)$$

The dielectric constants thus determined are set forth in Table 8 together with the film thickness.

TABLE 8

| Resin | Resinous solution | R:P[1] | Solvent | Prism coupler T[2] (Å) | Prism coupler R[3] | Ellipsometer T (Å) | Ellipsometer R | Profiler T (Å) | Dielectric constant |
|---|---|---|---|---|---|---|---|---|---|
| (a) | (a) | 100:0 | MIBK | 8168 | 1.433 | | | 7751 | 2.26 |
| (b) | (b) | | " | 8676 | 1.426 | 8700 | 1.426 | 8246 | 2.34 |
| (c) | (c) | | " | 8050 | 1.435 | | | 7961 | 2.31 |
| (d) | (d) | | " | 8565 | 1.427 | | | 8412 | 2.42 |
| (e) | (e) | | PGMEA | 12190 | 1.4263 | 12230 | 1.430 | 11968 | 2.42 |
| | (e-1) | 70:30 | " | 10606 | 1.3463 | 10651 | 1.345 | 10521 | 2.29 |
| (f) | (f) | 100:0 | " | 9164 | 1.4364 | 9224 | 1.433 | 9095 | 2.47 |
| | (f-1) | 70:30 | " | 9806 | 1.3465 | 9901 | 1.340 | 9767 | 2.27 |
| (g) | (g) | 100:0 | " | 10032 | 1.4333 | 10125 | 1.431 | 9931 | 2.49 |
| | (g-1) | 90:10 | " | 9674 | 1.3921 | 9855 | 1.386 | 9536 | 2.35 |
| | (g-2) | 50:50 | " | 10282 | 1.3109 | 10230 | 1.315 | 10103 | 1.67 |
| (h) | (h) | 100:0 | " | 9428 | 1.4339 | 9589 | 1.433 | 9321 | 2.64 |
| | (h-1) | 90:10 | " | 9344 | 1.3966 | 9252 | 1.395 | 9341 | 2.41 |
| | (h-2) | 70:30 | " | 9425 | 1.3510 | 9411 | 1.321 | 9420 | 2.17 |
| (i) | (i) | 100:0 | " | 9208 | 1.4312 | 9380 | 1.432 | 9100 | 2.65 |
| | (i-1) | 90:10 | " | 9099 | 1.3964 | 9112 | 1.384 | 9056 | 2.49 |
| | (i-2) | 70:30 | " | 9781 | 1.3435 | 9653 | 1.311 | 9653 | 2.26 |
| | (i-3) | 50:50 | " | 10738 | 1.3125 | 10023 | 1.309 | 10562 | 1.51 |
| (j) | (j) | 100:0 | " | 8518 | 1.4414 | 8574 | 1.441 | 8514 | 2.51 |
| | (j-1) | 70:30 | " | 8432 | 1.3356 | 8534 | 1.330 | 8234 | 2.31 |
| (k) | (k) | 100:0 | MIBK | 7335 | 1.420 | 7367 | 1.422 | 6584 | 2.30 |
| (l) | (l) | 100:0 | " | 7535 | 1.424 | 7644 | 1.423 | 7055 | 2.34 |

[1]resin:porogen(w/w)
[2]thickness
[3]refractive index

EXAMPLE 4

Analysis of Resinous Films for Mechanical Properties

EXAMPLE 4-1

Measurement of Hardness and Modulus of Resinous Films

Some of the resinous films formed in the above Example 3 were analyzed for hardness and modulus by using Nanoindenter II (MTS Co.). The film was indented until the indentation depth reached 10% of its whole thickness, which had been previously measured by use of a prism coupler. At this time, to secure the reliability of this measurement, 6 points were indented every test piece, and mean hardness and modulus were determined from a load-displacement curve. The results are set forth in Table 9.

TABLE 9

| Resinous solution | Mechanical properties Hardness(Gpa) | Mechanical properties Modulus(Gpa) |
|---|---|---|
| (e) | 0.85 | 4.93 |
| (e-1) | 0.38 | 2.87 |
| (f) | 0.89 | 5.57 |
| (f-1) | 0.37 | 2.79 |
| (g) | 1.00 | 6.16 |
| (g-1) | 0.72 | 4.56 |
| (g-2) | 0.34 | 2.74 |
| (h) | 1.06 | 6.36 |
| (h-1) | 0.83 | 4.70 |
| (h-2) | 0.54 | 3.78 |
| (i) | 1.04 | 6.62 |
| (i-1) | 0.82 | 5.07 |
| (i-2) | 0.48 | 3.52 |
| (i-3) | 0.38 | 2.90 |
| (j) | 1.06 | 6.72 |
| (j-1) | 0.46 | 3.29 |

EXAMPLE 4-2

Measurement of Crack-Free Thickness of Resinous Films

Siloxane-based resin (i) obtained from the above Example 1, and a mixture of resin (i):heptakis(2,3,6-tri-O-methyl)-β-cyclodextrin=7:3(w/w) were dissolved in propylene glycol methyl ether acetate (PGMEA), respectively, varying final concentration of the solid matter in the respective resinous solutions to 25, 27, 29, 31, 33, and 35 wt. %. Each of the resinous solutions was spin-coated onto a silicon wafer at a spin rate of 3,000 rpm for 30 sec. Under a nitrogen atmosphere, the coated wafer was baked on a hot plate for 1 min at 100° C. and for another minute at 250° C., to remove the organic solvent sufficiently. Next, the temperature of the wafer was elevated to 420° C. at a rate of 3° C./min under vacuum condition, and then the resinous coating film on the surface of the wafer was cured at the same temperature for 1 hr to afford a test piece. In order to find crack-free thickness, the resinous film of the test piece was observed with an optical microscope. The results are set forth in Table 10.

TABLE 10

| R:P[1] | Crack-free thickness(μm) |
|---|---|
| 100:0 | 1.7 |
| 70:30 | 1.5 |

[1]resin (i): heptakis(2,3,6-tri-O-methyl)-β-cyclodextrin(w/w)

EXAMPLE 5

Analysis of Resinous Films for Thermal Stability

Siloxane-based resin (i) obtained from the above Example 1, and a mixture of resin (i):heptakis(2,3,6-tri-O-methyl)-β-cyclodextrin=50:50(w/w) were dissolved in propylene glycol methyl ether acetate (PGMEA), respectively, at final concentration of 25 wt. %. Each of the resinous solutions was spin-coated onto a silicon wafer at a spin rate of 3,000 rpm for 30 sec. Under a nitrogen atmosphere, the coated wafer was baked on a hot plate for 1 min at 100° C. and for another minute at 250° C., to remove the organic solvent sufficiently. Subsequently, the temperature of the wafer was elevated to 420° C. at a rate of 3° C./min under vacuum condition, and then the wafer was cured at the same temperature for 1 hr to afford a test piece. Film thickness and refractive index of the test piece were measured by use of a prism coupler. Thereafter, the temperature elevation and curing were repeated twice in the same manner as described above, followed by the measurement of film thickness and refractive index of the test piece. Change rates of thickness and refractive index of the respective films are set forth in Table 11.

TABLE 11

| | Thickness(Å) | | R.I. | |
|---|---|---|---|---|
| R:P[1] | Mean | Change rate(%)[2] | Mean | Change rate(%)[3] |
| 100:0 | 9732 | 0.21 | 1.437 | 0.07 |
| 50:50 | 13714 | 1.65 | 1.332 | 0.19 |

[1]resin (i):heptakis(2,3,6-tri-O-methyl)-β-cyclodextrin(w/w)
[2]change rate of thickness(%) = [thickness of the film cured once − thickness of the film cured three times] ÷ thickness of the film cured once × 100
[3]change rate of refractive index(%) = [refractive index of the film cured once − refractive index of the film cured three times] ÷ refractive index of the film cured once × 100

As described above, siloxane-based resins of the present invention are useful for forming low dielectric insulating film between interconnect layers in semiconductor devices, which is excellent in mechanical properties, thermal stability and resistance to crack.

The simple modification and change of the present invention will be readily made by any skilled person in the art and it should be understood that all of such modification and change are encompassed within the scope of the present invention.

What is claimed is:

1. A siloxane-based resin prepared by hydrolyzing and polycondensing a cyclic siloxane compound of formula (1), together with a silane compound of formula (3) or by hydrolyzing and polycondensing the cyclic siloxane compound of formula (1) together with the silane compound of formula (3) and a silane compound of formula (4), in an organic solvent in the presence of a catalyst and water:

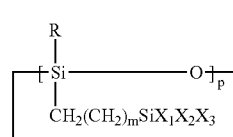
(1)

wherein,

R is H, $C_{1-3}$ alkyl, $C_{3-10}$ cycloalkyl, or $C_{6-15}$ aryl;

each of $X_1$, $X_2$, and $X_3$ is, independently, $C_{1-3}$ alkyl, $C_{1-10}$ alkoxy, or halogen, provided that at least one is alkoxy or halogen;

p is an integer from 3 to 8; and m is an integer from 1 to 10;

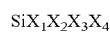
(3)

wherein, each of $X_1$, $X_2$, $X_3$, and $X_4$ is, independently, $C_{1-10}$ alkoxy, or halogen;

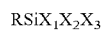
(4)

wherein,

R is H, $C_{1-3}$ alkyl, $C_{3-10}$ cycloalkyl, or $C_{6-15}$ aryl;

each of $X_1$, $X_2$, and $X_3$ is, independently, $C_{1-3}$ alkyl, $C_{1-10}$ alkoxy, or halogen, provided that at least one is alkoxy or halogen, and wherein the resin has a molecular weight of 3,000 to 500,000.

2. The siloxane-based resin of claim 1, wherein a molar ratio of the compound of formula (1) to the compound of formula (3) is between 99.9:0.1 and 0.1:99.9.

3. The siloxane-based resin of claim 1, wherein a molar ratio of the compound of formula (1) to the compound of formula (3) is between 95:5 and 50:50.

4. The siloxane-based resin of claim 1, wherein the resin contains 1–98 mol% of the compound of formula (1), 1–98 mol% of the compound of formula (3) and 1–98 mol% of the compound of formula (4).

5. The siloxane-based resin of claim 1, wherein the resin has a molecular weight of 3,000 to 100,000.

6. A siloxane-based resin prepared by hydrolyzing and polycondensing a cage-shape siloxane compound of any of formulas (2a) through (2c), together with a silane compound of formula (3) and/or a silane compound of formula (4), in an organic solvent in the presence of a catalyst and water:

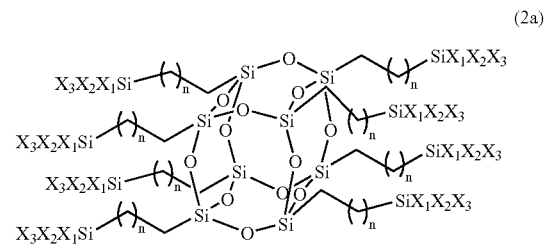
(2a)

-continued

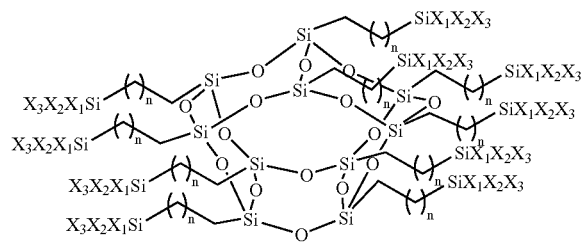
(2b)

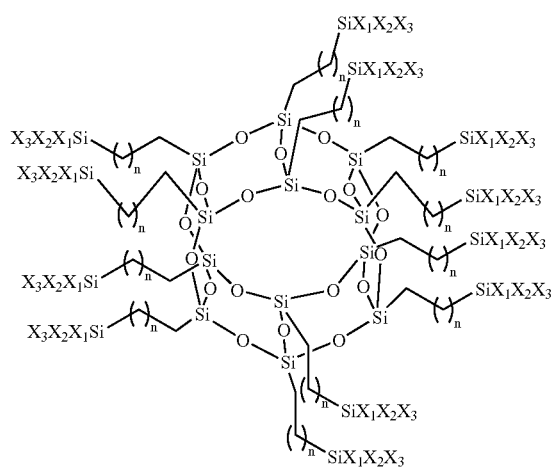
(2c)

in the above formulas (2a) through (2c),
each of $X_1$, $X_2$, and $X_3$ is, independently, $C_{1-3}$ alkyl, $C_{1-10}$ alkoxy, or halogen, provided that at least one is alkoxy or halogen; and
n is an integer from 1 to 12;

$$SiX_1X_2X_3X_4 \qquad (3)$$

wherein,
each of $X_1$, $X_2$, $X_3$, and $X_4$ is, independently, $C_{1-10}$ alkoxy, or halogen;

$$RSiX_1X_2X_3 \qquad (4)$$

wherein,
R is H, $C_{1-3}$ alkyl, $C_{3-10}$ cycloalkyl, or $C_{6-15}$ aryl; and
each of $X_1$, $X_2$, and $X_3$ is, independently, $C_{1-3}$ alkyl, $C_{1-10}$ alkoxy, or halogen, provided that at least one is alkoxy or halogen.

7. The siloxane-based resin of claim 6, wherein a molar ratio of the compound of formula (2a–2c) to the compound of formula (4) is between 99.9:0.1 and 0.1:99.9.

8. The siloxane-based resin of claim 6, wherein a molar ratio of the compound of formula (2a–2c) to the compound of formula (4) is between 5:95 and 50:50.

9. The siloxane-based resin of claim 6, wherein the resin contains 1–98 mol% of the compound of formula (2a–2c), 1–98 mol% of the compound of formula (3) and 1–98 mol% of the compound of formula (4).

10. The siloxane-based resin of claim 6, wherein the resin has a molecular weight of 3,000 to 500,000.

11. The siloxane-based resin of claim 6, wherein the resin has a molecular weight of 3,000 to 100,000.

* * * * *